United States Patent
Watanabe (10) Patent No.: US 10,348,183 B2
(45) Date of Patent: Jul. 9, 2019

(54) SEMICONDUCTOR DEVICE AND ACTUATOR SYSTEM

(71) Applicant: Renesas Electronics Corporation, Tokyo (JP)

(72) Inventor: Shinpei Watanabe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/900,949

(22) Filed: Feb. 21, 2018

(65) Prior Publication Data

US 2018/0301978 A1    Oct. 18, 2018

(30) Foreign Application Priority Data

Apr. 14, 2017    (JP) .................. 2017-080506

(51) Int. Cl.
| | |
|---|---|
| *H02P 1/54* | (2006.01) |
| *H02M 1/088* | (2006.01) |
| *H03K 17/56* | (2006.01) |
| *H02P 5/00* | (2016.01) |
| *H02M 1/32* | (2007.01) |
| *H02M 7/5387* | (2007.01) |
| *H02M 1/00* | (2006.01) |

(52) U.S. Cl.
CPC ............ *H02M 1/088* (2013.01); *H02M 1/32* (2013.01); *H02P 5/00* (2013.01); *H03K 17/56* (2013.01); *H02M 7/5387* (2013.01); *H02M 2001/0003* (2013.01); *H02M 2001/008* (2013.01)

(58) Field of Classification Search
CPC ............................. H02P 7/04; H02M 7/5387
See application file for complete search history.

(56) References Cited

U.S. PATENT DOCUMENTS

| | | | |
|---|---|---|---|
| 8,917,134 B2 | 12/2014 | Amada | |
| 2012/0068648 A1* | 3/2012 | Kawakami | ............... H02P 6/14 318/400.29 |
| 2014/0203559 A1* | 7/2014 | Wagoner | ............ H02M 5/4585 290/44 |

FOREIGN PATENT DOCUMENTS

JP        2014-093373 A    5/2014

* cited by examiner

*Primary Examiner* — Karen Masih
(74) *Attorney, Agent, or Firm* — McDermott Will & Emery LLP

(57) ABSTRACT

A semiconductor device includes a plurality of H-bridge circuits and a logic circuit which is commonly used for the plurality of H-bridge circuits. The logic circuit controls driving of each of the plurality of H-bridge circuits on the basis of signals which are input thereto in such a manner that a combination of respective driving states of the plurality of H-bridge circuits meets a predetermined condition.

10 Claims, 7 Drawing Sheets

SEMICONDUCTOR DEVICE AND ACTUATOR SYSTEM

CROSS-REFERENCE TO RELATED APPLICATIONS

The disclosure of Japanese Patent Application No. 2017-080506 filed on Apr. 14, 2017 including the specification, drawings and abstract is incorporated herein by reference in its entirety.

BACKGROUND

The present invention relates to a semiconductor device and an actuator system and relates to, for example, the semiconductor device which includes H-bridge circuits and the actuator system which includes the semiconductor device.

The H-bridge circuit is used as a driver circuit which controls a solenoid valve and/or an actuator such as a motor and so forth used to operate a powered window, a door lock and so forth of a vehicle. Such an on-vehicle driver circuit as described above controls the actuator which handles large current of several amperes (A) to several tens of amperes and therefore high functional safety is requested to the on-vehicle driver circuit. For example, Japanese Unexamined Patent Application Publication No. 2014-093373 discloses a semiconductor device which controls the motor by using an H-bridge circuit.

In addition, in a case where control using the plurality of H-bridge circuits is achieved, use of a plurality of chips on each of which one H-bridge circuit is formed is conceivable. However, in recent years, investigations of a one-chip solution which is a technology for achieving control by one chip on which the plurality of H-bridge circuits are formed are promoted.

SUMMARY

In a case where the plurality of H-bridge circuits are used, it is preferable to control propriety of driving of each H-bridge circuit in accordance with a desirable condition. Therefore, a technology for achieving such control as described above is requested.

Other matters to be solved and novel features of the present invention will become apparent from description of the specification and the appended drawings.

According to one embodiment of the present invention, there is provided a semiconductor device which includes a plurality of H-bridge circuits and a logic circuit which controls driving of each of the plurality of H-bridge circuits on the basis of signals which are input into the logic circuit in such a manner that a combination of respective driving states of the plurality of H-bridge circuits meets a predetermined condition and is commonly used for the plurality of H-bridge circuits.

According to another embodiment of the present invention, there is provided an actuator system which includes an actuator and a semiconductor device.

According to the above-described embodiments, in a case where the plurality of H-bridge circuits are used, it is possible to control the prosperity of driving of each of the respective H-bridge circuits in accordance with the desirable condition.

DETAILED DESCRIPTION

For clarification of description, the following description of the specification and illustration of drawings are appropriately omitted and simplified. Incidentally, in the respective drawings, the same numerals are assigned to the same elements and duplicated description thereof is omitted as necessary.

<Summary of Embodiments>

Figure 1:
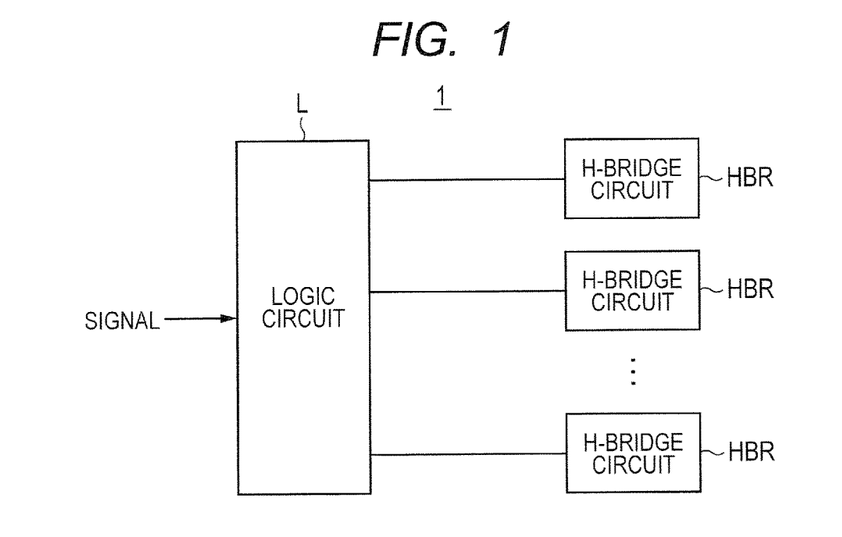
FIG. 1 is a block diagram illustrating one example of a configuration of a semiconductor device according to a summary of embodiments.

Before describing details of embodiments, a summary of the embodiments of the present invention will be described. FIG. 1 is a block diagram, illustrating one example of a configuration of a semiconductor device 1 pertaining to the summary of the embodiments. The semiconductor device 1 includes a logic circuit L and a plurality of H-bridge circuits The logic circuit L is a circuit which controls driving of the H-bridge circuits HBR and a logic circuit of the type which is commonly used for the plurality of H-bridge circuits HBR as illustrated in FIG. 1. That is, each logic circuit L is not provided for each of the plurality of H-bridge circuits HBR and one logic circuit L is provided for the plurality of H-bridge circuits HBR. Accordingly, the logic circuit L is a circuit which is shared among the plurality of H-bridge circuits HBR for controlling driving of each of the plurality of H-bridge circuits on the basis of signals which are input into the logic circuit L. The logic circuit L controls driving of each of the plurality of H-bridge circuits HBR on the basis of the signals which are input into the logic circuit L in such a manner that a combination of respective driving states of the plurality of H-bridge circuits HBR meets a predetermined condition. Incidentally, the driving state means a state indicating whether the H-bridge circuit HBR concerned is driven.

In the semiconductor device 1, each logic circuit L is not provided for each H-bridge circuit HBR and one logic circuit L is provided to be commonly used for the plurality of H-bridge circuits BHR as described above. Then, the above-mentioned one logic circuit L controls driving of each of the plurality of H-bridge circuits BHR in such a manner that the combination of the respective driving states of the plurality of H-bridge circuits HBR meets the predetermined condition. Therefore, according to the semiconductor device 1, it is possible to control the propriety of driving of each H-bridge circuit HBR in accordance with a desirable condition.

<First Embodiment>

Figure 2:
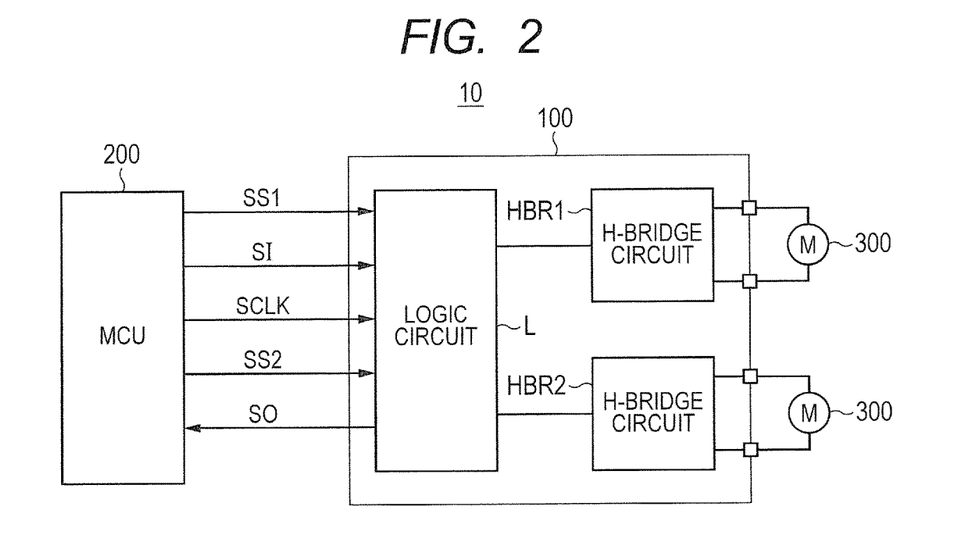
FIG. 2 is a block diagram illustrating one example of a configuration of a semiconductor device according to a first embodiment.

Then, details of the embodiments will be described. FIG. 2 is a block diagram, illustrating one example of a configuration of a semiconductor device 10 according to a first embodiment. The semiconductor device 10 includes an H-bridge circuit HBR1, an H-bridge circuit HBR2, the logic circuit L which is commonly used for the H-bridge circuits HBR1 and HBR2, an MCU (Micro Controller Unit) 200 and so forth. The H-bridge circuit HBR1, the H-bridge circuit HBR2 and the logic circuit L are implemented on the same, that is, one semiconductor chip 100. Incidentally, the MCU 200 is coupled with the logic circuit L via, for example, a Serial Peripheral Interface and therefore signal transmission and reception are possible between the MCU 200 and the logic circuit L.

Actuators 300 such as motors and so forth are coupled to the H-bridge circuit HBR1 and the H-bridge circuit HBR2 respectively. Each of the H-bridge circuit HBR1 and the H-bridge circuit HBR2 controls a state of current (that is, presence/absence of the current and a direction of the current) which flows to the actuator 300 by turning a switch housed in each of the H-bridge circuits HBR1 and HBR2 on and off in accordance with a signal which is output from the logic circuit L. Thereby, each of the H-bridge circuit HBR1 and the H-bridge circuit HBR2 controls forward rotation, reverse rotation and stop of the actuator 300 concerned. Incidentally, an actuator system is configured by the semiconductor device 10 and the actuator 300.

The logic circuit L is a logic circuit which is commonly used for the plurality of H-bridge circuits HBR1 and HBR2 and controls each of the H-bridge circuits HBR1 and HBR2 on the basis of signals from, the MCU 200. A clock signal SCLK, a control information input signal S1 and select signals SS1 and SS2 are input into the logic circuit L from, the MCU 200. In addition, the logic circuit L outputs an output signal SO to the MCU 200.

The clock signal SCLK is a clock signal used to operate the logic circuit L. The control information input signal S1 is a signal used to give various kinds of control information (commands) to the logic circuit L. For example, one kind of the control information is a command used to designate a state of the switch of the H-bridge circuit HBR1 and a state of the switch of the H-bridge circuit HBR2. The logic circuit L changes over the states of the switches of the H-bridge circuits HBR1 and HBR2 in accordance with the control information input signal S1. Here, the control information input signal S1 is a signal which is commonly used for the H-bridge circuit HBR1 and the H-bridge circuit HBR2. Accordingly, the control information input signal S1 is a signal which is shared for control of the plurality of H-bridge circuits (the H-bridge circuits HBR1 and HBR2). Incidentally, the control information input signal S1 is also called a control signal.

The select signal SS1 is a signal used to designate whether the H-bridge circuit HBR1 is validated. In addition, the select signal SS2 is a signal used to designate whether the H-bridge circuit HBR2 is validated. As described above, the select signal is a signal used for each of the H-bridge circuits HBR1 and HBR2. Incidentally, the select signals SS1 and SS2 are also called valid signals.

The output signal SO is a signal that the logic circuit L outputs. The logic circuit L may output, for example, the received control information as the output signal SO. In this case, the MCU 200 is able to confirm whether the transmitted control information is correctly received by the logic circuit L on the basis of the output signal SO. In addition, the logic circuit L may output an error signal as the output signal SO. For example, in a case where the signal states of the select signals SS1 and SS2 are predetermined signal states, the logic circuit L may output the error signal. Detection of occurrence of abnormality becomes possible by outputting the error signal.

The MCU 200 brings the select signal SS1 into the signal state which indicates to validate the H-bridge circuit HBR1 for the purpose of driving the H-bridge circuit HBR1. Specifically, the MCU 200 sets the select signal SS1 to, for example, a low level. In addition, the MCU 200 brings the select signal SS2 into the signal state which indicates to validate the H-bridge circuit HBR2 for the purpose of driving the H-bridge circuit HBR2. Specifically, the MCU 200 sets the select signal SS2 to, for example, the low level. Conversely, the MCU 200 brings the select signal SS1 into the signal state which indicates to invalidate the H-bridge circuit HBR1 for the purpose of not driving the H-bridge circuit HBR1. Specifically, the MCU 200 sets the select signal SS1 to, for example, a high level. In addition, the MCU 200 brings the select signal SS2 into the signal state which indicates to invalidate the H-bridge circuit I-IBR2 for the purpose of not driving the H-bridge circuit HBR2. Specifically, the MCU 200 sets the select signal SS2 to, for example, the high level.

In addition, in a case where at least one of the H-bridge circuits HBR1 and HBR2 is to be driven, the MCU 200 outputs the control information input signal S1 used to instruct the state of the switch of the H-bridge circuit to be driven (that is, the direction of the current which flows in the above-described H-bridge circuit) to the logic circuit L.

The logic circuit L controls driving of each of the H-bridge circuits HBR1 and HBR2 on the basis of the control information input signal S1 and each of the select signals SS1 and SS2 which are output from the MCU 200, Incidentally, as described above, the control information input signal S1 is the signal which is commonly used for the H-bridge circuit HBR1 and the H-bridge circuit HBR2. Therefore, in a case where both the H-bridge circuit HBR1 and the H-bridge circuit HBR2 are to be driven, the logic circuit L drives both the H-bridge circuits BHR1 and HBR2 in accordance with the same control information.

Here, the logic circuit L controls driving of each of the H-bridge circuits HBR1 and HBR2 in such a manner that a combination of the driving state (driving or non-driving) of the H-bridge circuit HBR1 with the driving state (driving or non-driving) of the H-bridge circuit HBR2 meets a condition which is defined in advance in accordance with specifications and/or from the viewpoint of functional safety. In the first embodiment, since the logic circuit L is the circuit which is commonly used for the H-bridge circuits HBR1 and HBR2, the logic circuit L is able to control the driving states of the H-bridge circuits HBR1 and HBR2 in the lump.

Figure 3:
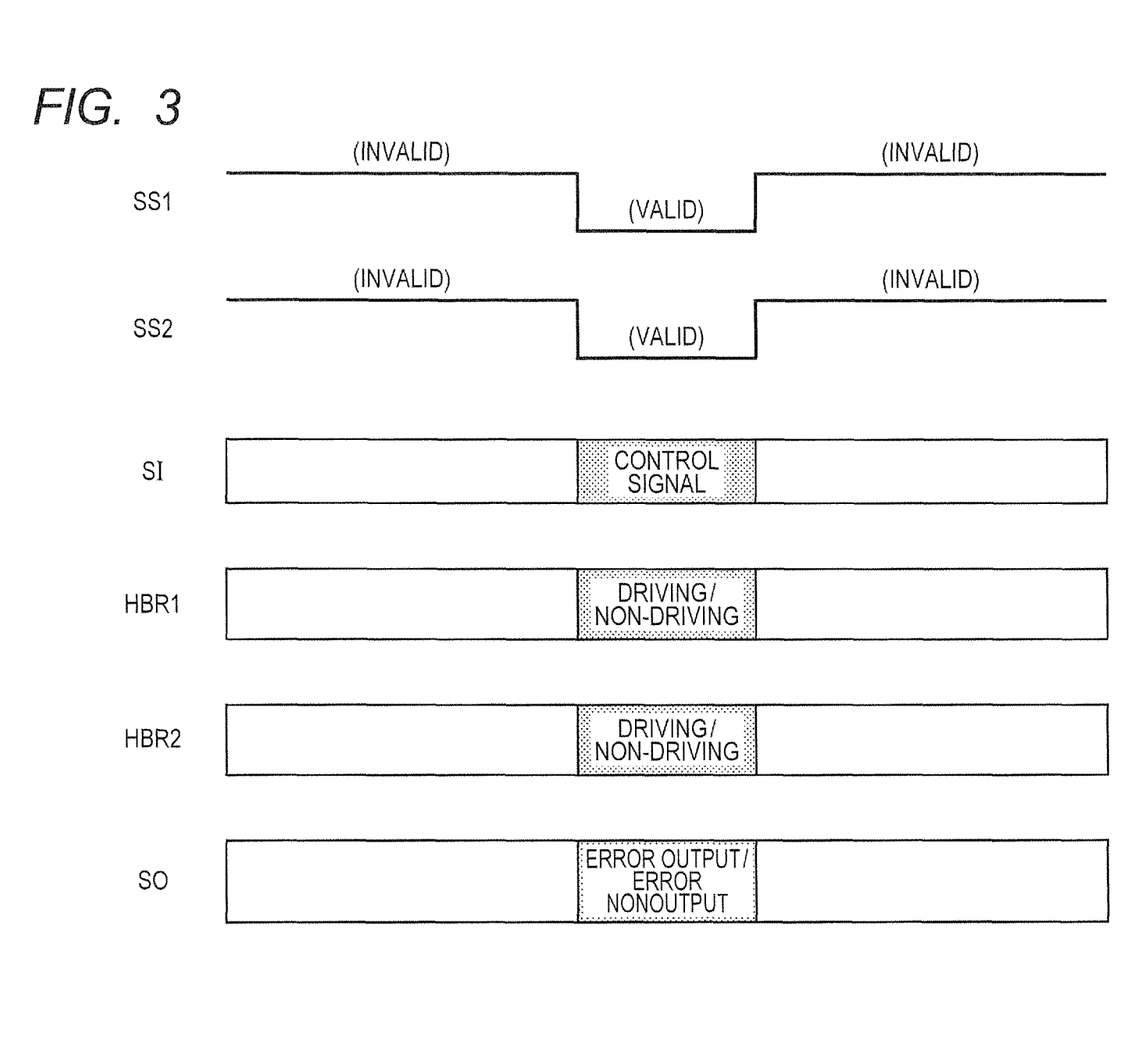
FIG. 3 is a time chart illustrating one example of driving states of H-bridge circuits which are controlled by a logic circuit.

FIG. 3 is a time chart illustrating one example of the driving states of the H-bridge circuits HBR1 and HBR2 which are controlled by the logic circuit L. FIG. 3 illustrates the example of control by the logic circuit L in a case where both the select signal SS1 and the select signal SS2 are in the signal states indicating to validate the H-bridge circuits HBR1 and HBR2, As illustrated in FIG. 3, the logic circuit L is able to perform optional control. That is, in a case where both the select signal SS1 and the select signal SS2 indicate to validate the H-bridge circuits HBR1 and HBR2 respectively, the logic circuit L achieves a combination which is defined in advance, for example, in a first combination, a second combination, a third combination and a fourth combination.

Here, the first combination is a combination of the driving states that the H-bridge circuit HBR1 is driven in accordance with the control signal and the H-bridge circuit HBR2 is not driven. The second combination is a combination of the driving states that the H-bridge circuit HBR2 is driven in accordance with the control signal and the H-bridge circuit HBR1 is not driven. The third combination is a combination of the driving states that both the H-bridge circuit HBR1 and the H-bridge circuit HBR2 are driven in accordance with the control signal. The fourth combination is a combination of the driving states that both the H-bridge circuit HBR1 and the H-bridge circuit HBR2 are not driven. Incidentally, that the logic circuit L achieves control of which combination is defined in advance in accordance with the specification and/or from the viewpoint of the functional safety. Accordingly, the logic circuit L is implemented using a circuit configured to achieve a desirable combination of the driving states.

In addition, in a case where both the select signal SS1 and the select signal SS2 indicate to validate the H-bridge circuits HBR1 and HBR2 respectively, the logic circuit L may output or may not output the error signal as the output signal SO. Whether the error signal is output is also defined in advance in accordance with the specification and/or from the viewpoint of the functional safety and the circuit is implemented in such a manner that a desirable signal outputting operation is achieved.

Accordingly, for example, in a case where all the valid signals (the select signals) for the plurality of H-bridge circuits HBR1 and HBR2 indicate to validate the H-bridge circuits HBR1 and HBR2 respectively, the logic circuit L may control not to drive all the H-bridge circuits HBR1 and HBR2. In a case where the logic circuit L achieves such control as described above, it is possible to suppress driving of the H-bridge circuits HBR1 and HBR2, for example, in a state where all the valid signals for the plurality of H-bridge circuits HBR1 and HBR2 indicate to validate the H-bridge circuits HBR1 and HBR2 respectively, not depending on driving instructions from the MCU 200.

In addition, for example, in a case where all the valid signals (the select signals) for the plurality of H-bridge circuits HBR1 and HBR2 indicate to validate the H-bridge circuits HBR1 and HBR. respectively, the logic circuit L may drive only a predetermined H-bridge circuit in the plurality of H-bridge circuits HBR1 and HBR2 in accordance with the control signal. In a case where the logic circuit L achieves such control as described above, it is possible to prefer driving of the predetermined H-bridge circuit and to suppress driving of other H-bridge circuits, for example, in the state where all the valid signals for the plurality of the H-bridge circuits HBR1 and HBR2 indicate to validate the H-bridge circuits HBR1 and HBR2 respectively, not depending on the driving instructions from the MCU 200.

Figure 4:
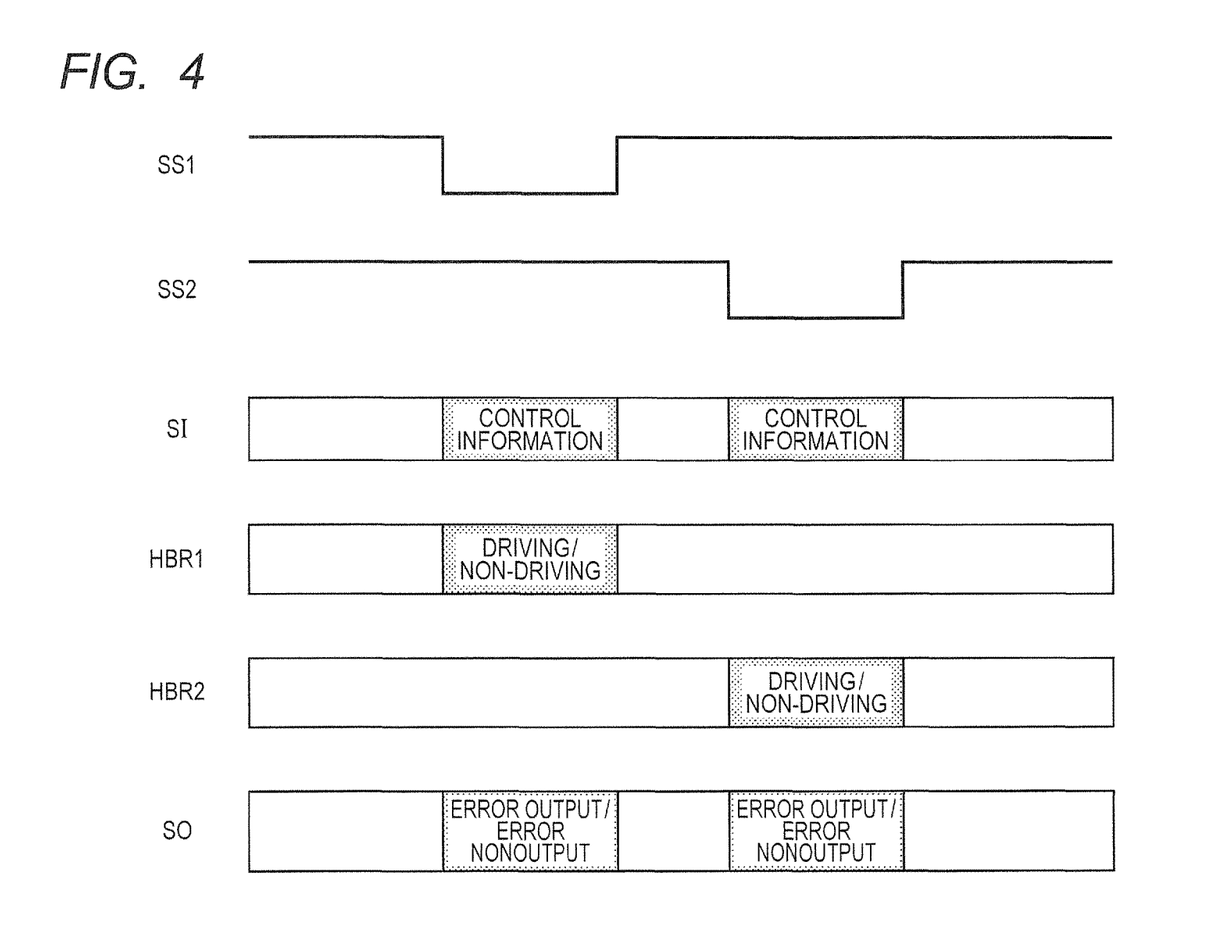
FIG. 4 is a time chart illustrating another example of the driving states of the H-bridge circuits which are controlled by the logic circuit.

FIG. 4 is a time chart illustrating another example of the driving states of the H-bridge circuits HBR1 and HBR2 which are controlled by the logic circuit L. FIG. 4 illustrates one example of control by the logic circuit L in a case of the signal states that one of the select signals SS1 and SS2 indicates to validate the corresponding H-bridge circuit, and the other of the select signals SS1 and SS2 indicates to invalidate the corresponding H-bridge circuit. Also in this case, the logic circuit L is able to perform optional control as illustrated in FIG. 4. That is, in a case where one of the select signals SS1 and SS2 indicates to validate the corresponding H-bridge circuit and the other of the select signals SS1 and SS2 indicates to invalidate the corresponding H-bridge circuit, the logic circuit L achieves a combination which is defined in advance, for example, in a fifth combination, a sixth combination, a seventh combination and an eighth combination.

Here, the fifth combination is a combination of the driving states that in a case where the select signal SS1 indicates to validate the H-bridge circuit HBR1 and the select signal SS2 indicates to invalidate the H-bridge circuit HBR2, the H-bridge circuit HBR1 is driven in accordance with the control signal and the H-bridge circuit HBR2 is not driven. The sixth combination is a combination of the driving states that in a case where the select signal SS1 indicates to validate the H-bridge circuit HBR1 and the select signal SS2 indicates to invalidate the H-bridge circuit HBR2, both the H-bridge circuit HBR1 and the H-bridge circuit HBR2 are not driven. The seventh combination is a combination of the driving states that in a case where the select signal SS1 indicates to invalidate the H-bridge circuit HBR1 and the select signal SS2 indicates to validate the H-bridge circuit HBR2, the H-bridge circuit HBR2 is driven in accordance with the control signal and the H-bridge circuit HBR1 is not driven. The eighth combination is a combination of the driving states that in a case where the select signal SS1 indicates to invalidate the H-bridge circuit HBR1 and the select signal SS2 indicates to validate the H-bridge circuit HBR2, both the H-bridge circuit HBR1 and the H-bridge circuit HBR2 are not driven. Incidentally, that the logic circuit L achieves control of which combination is defined in advance in accordance with the specification and/or from the viewpoint of the functional safety. Accordingly, the logic circuit L is implemented using a circuit configured to achieve the desirable combination of the driving states.

In addition, in a case where one of the select signals SS1 and SS2 indicates to validate the corresponding H-bridge circuit and the other of the select signals SS1 and SS2 indicates to invalidate the corresponding H-bridge circuit, the logic circuit L may output and may not output the error signal as the output signal SO. Whether the error signal is output is also defined in advance in accordance with the specification and/or from the viewpoint of the functional safety and the circuit is implemented in such a manner that the desirable signal outputting operation is achieved.

Accordingly, for example, in a case where some of the valid signals (the select signals) for the plurality of H-bridge circuits HBR1 and HBR2 indicate to validate the corresponding H-bridge circuits and the other valid signals (the select signals) indicate to invalidate the corresponding H-bridge circuits, the logic circuit L may control not to drive all the H-bridge circuits HBR1 and HBR2. In a case where the logic circuit L achieves such control as described above, it is possible to suppress driving of the H-bridge circuits HBR1 and HBR2, for example, in a state where only some of the valid signals indicate to validate the corresponding H-bridge circuits, not depending on the driving instructions from the MCU 200.

Figure 5:
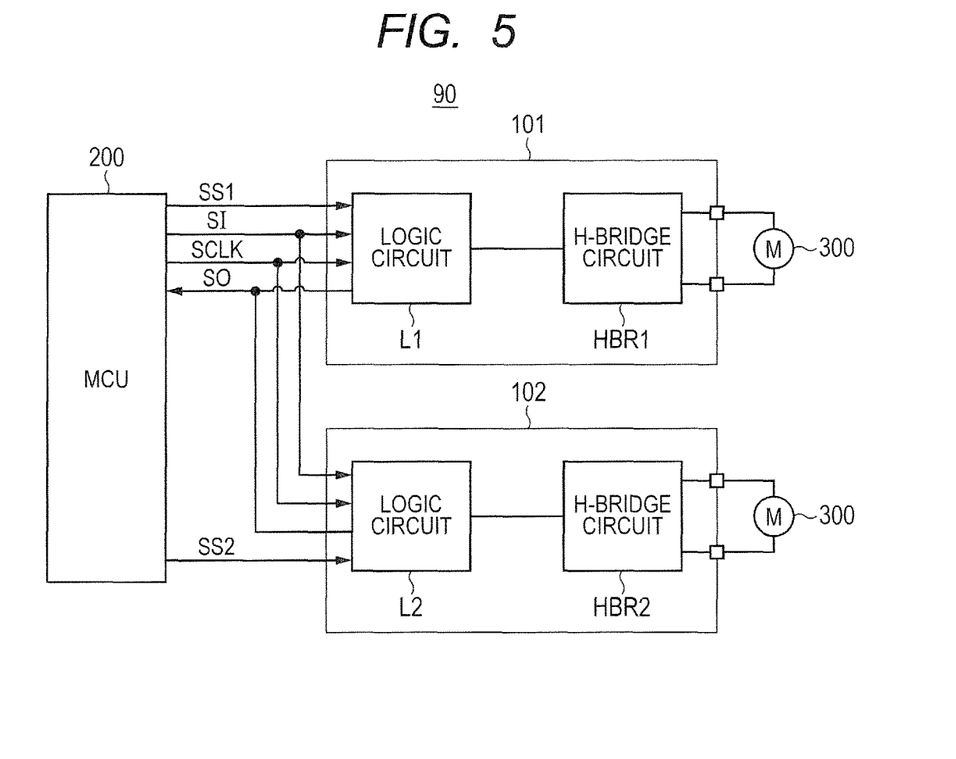
FIG. 5 is a block diagram illustrating one example of a configuration of a semiconductor device according to a comparative example.

Here, a comparative example will be described. FIG. 5 is a block diagram illustrating one example of a configuration of a semiconductor device 90 according to the comparative example. The semiconductor device 90 according to the comparative example is different from the semiconductor device 10 in the point that a logic circuit L1 and the H-bridge circuit HBR1 are implemented on a semiconductor chip 101 and a logic circuit L2 and the H-bridge circuit HBR2 are implemented on a semiconductor chip 102. That is, in the semiconductor deice 90, the logic circuit is provided for every H-bride circuit. The clock signal SCLK, the control information input signal S1, the select signals SS1 and SS2 and the output signal SO are transmitted and received between the MCU 200 and the logic circuit L1 and between the MCU 200 and the logic circuit L2 also in the semiconductor device 90 similarly to the semiconductor device 10. However, although the select signal SS1 is input into the logic circuit L1, the select signal SS2 is not input into the logic circuit L1. Likewise, although the select signal SS2 is input into the logic circuit L2, the select signal SS1 is not input into the logic circuit L2. Accordingly, the logic circuit L1 is not able to grasp the driving instructions from the MCU 200 to the H-bridge circuit HBR2. Likewise, the logic circuit L2 is not able to grasp the driving instructions from the MCU 200 to the H-bridge circuit HBR1. In addition, a control object of the logic circuit L1 is limited to only the H-bridge circuit HBR1 and the control object of the logic circuit L2 is limited to only the H-bridge circuit HBR2. Accordingly, in the semiconductor device 90, it is difficult to control the driving states of the plurality of H-bridge circuits HBR1 and HBR2 in the lump in accordance with the plurality of select signals SS1 and SS2.

On the other hand, in the semiconductor device 10, one logic circuit L which is commonly used for the H-bridge circuits HBR1 and HBR2 is provided and the logic circuit L performs control in such a manner that the combination of the respective driving states of the H-bridge circuits HBR1 and HBP2 meets the predetermined condition. Therefore, the semiconductor-device 10 makes it possible to control the propriety of driving of the respective H-bridge circuits HBR1 and HBR2 in accordance with the desirable condition. In addition, as described above, the logic circuit L controls driving of each of the H-bridge circuits HBR1 and HBR2 on the basis of the control information input signal S1 and the select signals SS1 and SS2 particularly. Accordingly, it is possible to achieve control of the driving states according to each combination of the plurality of select signals SS1 and SS2.

<Second Embodiment>

Then, a second embodiment will be described. The second embodiment is different from the first embodiment in the point that the logic circuit L outputs chip specification information of a semiconductor chip 100. The chip specification information is information used to specify the semiconductor chip 100 such as the version and so forth of the semiconductor chip 100.

The logic circuit L according to the second embodiment outputs the chip specification information of the semiconductor chip 100 in accordance with a readout command from the MCU 200. Describing in more detail, in a case where at least one of the select signals SS1 and SS2 is at the low level, the logic circuit L outputs the chip specification information in accordance with the readout command. Incidentally, the chip specification information may be output in accordance with the readout command, not depending on the signal states of the select signals SS1 and SS2. The readout command is contained in the control information input signal S1 and is informed from the MCU 200 to the logic circuit L. The logic circuit L receives the readout command from the MCU 200, then reads out the chip specification information which is stored in, for example, a memory circuit such as a register and so forth which is implemented on the semiconductor chip 100 and outputs the read-out chip specification information as the output signal SO.

Figure 6:
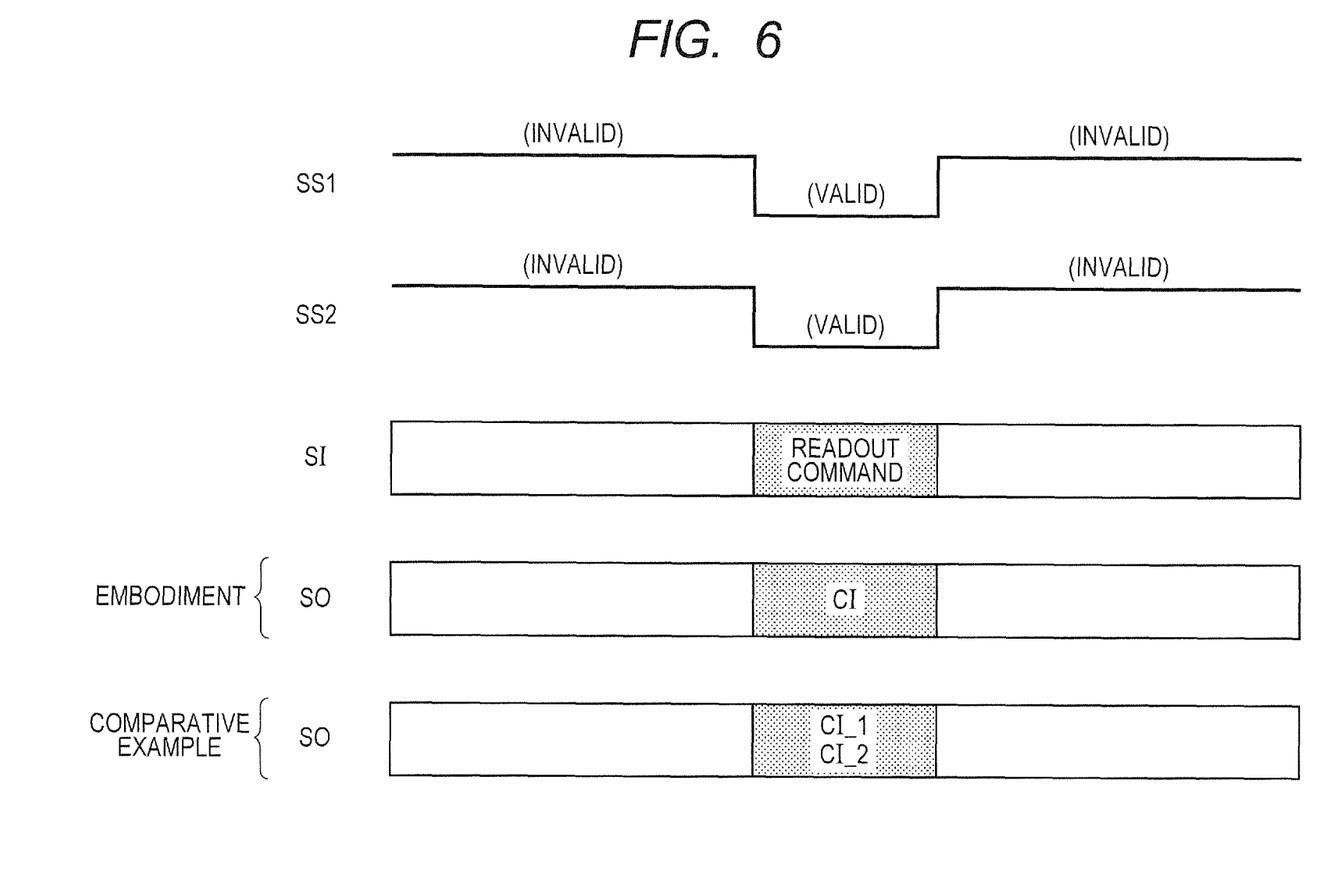
FIG. 6 is a time chart illustrating one example of output of chip specification information.

FIG. 6 is a time chart illustrating one example of output of the chip specification information. FIG. 6 also illustrates the output of the chip specification information in the above-described comparative example in addition to the output of the chip specification information in the second embodiment. As illustrated in FIG. 5, the semiconductor device 90 according to the comparative example includes the semiconductor chip 101 and the semiconductor chip 102. Therefore, in a case where the select signal SS1 is at the low level, the logic circuit L1 which is implemented on the semiconductor chip 101 outputs chip specification information CI_1 of the semiconductor chip 101 as the output signal SO in accordance with the readout command in the control information input signal S1. In addition, in a case where the select signal SS2 is at the low level, the logic circuit L2 which is implemented on the semiconductor chip 102 outputs chip specification information CI_2 of the semiconductor chip 102 as the output signal SO in accordance with the readout command in the control information input signal S1.

Here, in the semiconductor device 90, a signal line of the output signal SO of the logic circuit L1 and a signal line of the output signal SO o the logic circuit L2 are joined together into one signal line and this signal line is coupled to the MCU 200. That is, the output signal SO from the logic circuit L1 and the output signal SO from the logic circuit L2 are input into the MCU 200 in a superimposed state. Accordingly, in a case where both the select signal SS1 and the select signal SS2 are at the low levels, the output signal SO which is input into the MCU 200 is a signal of the form that the signal indicating the chip specification information CI_1 and the signal indicating the chip specification information CI_2 are mutually superimposed as illustrated in FIG. 6. For this reason, the MCU 200 is not able to appropriately acquire the chip specification information.

On the other hand, in the second embodiment, one logic circuit L is implemented on one semiconductor chip 100. Therefore, only chip specification information CI of the semiconductor chip 100 is input into the MCU 200 as the chip specification information in the form of the output signal SO from the logic circuit L as illustrated in FIG. 6. For this reason, the MCU 200 is able to appropriately acquire the chip specification information. Therefore, according to the second embodiment, appropriate management of the semiconductor chip 100 used in the semiconductor device 10 becomes possible. Incidentally, also in the semiconductor device 90 according to the comparative example, it becomes possible also for the semiconductor device 90 according to the comparative example to appropriately acquire the chip specification information by distributing wiring of the output signal SO to the MCU 200 also to the respective logic circuits L1 and L2. However, in this case, an increase in the number of wiring lines and an increase in size of a processing circuit in the MCU 200 are induced. On the other hand, according to the second embodiment, it becomes possible to appropriately acquire the chip specification information while suppressing such an increase in circuit scale as described above.

<Third Embodiment>

Then, a third embodiment will be described. While, in the first embodiment, the driving states of the H-bridge circuits HBR1 and HBR2 are decided in accordance with the signal states of the select signals SS1 and SS2, other signals may be used for decision of the driving states of the H-bridge circuits HBR1 and HBR2. In the third embodiment, decision of the driving states of the H-bridge circuits HBR1 and HBR2 using other signals will be described.

Figure 7:
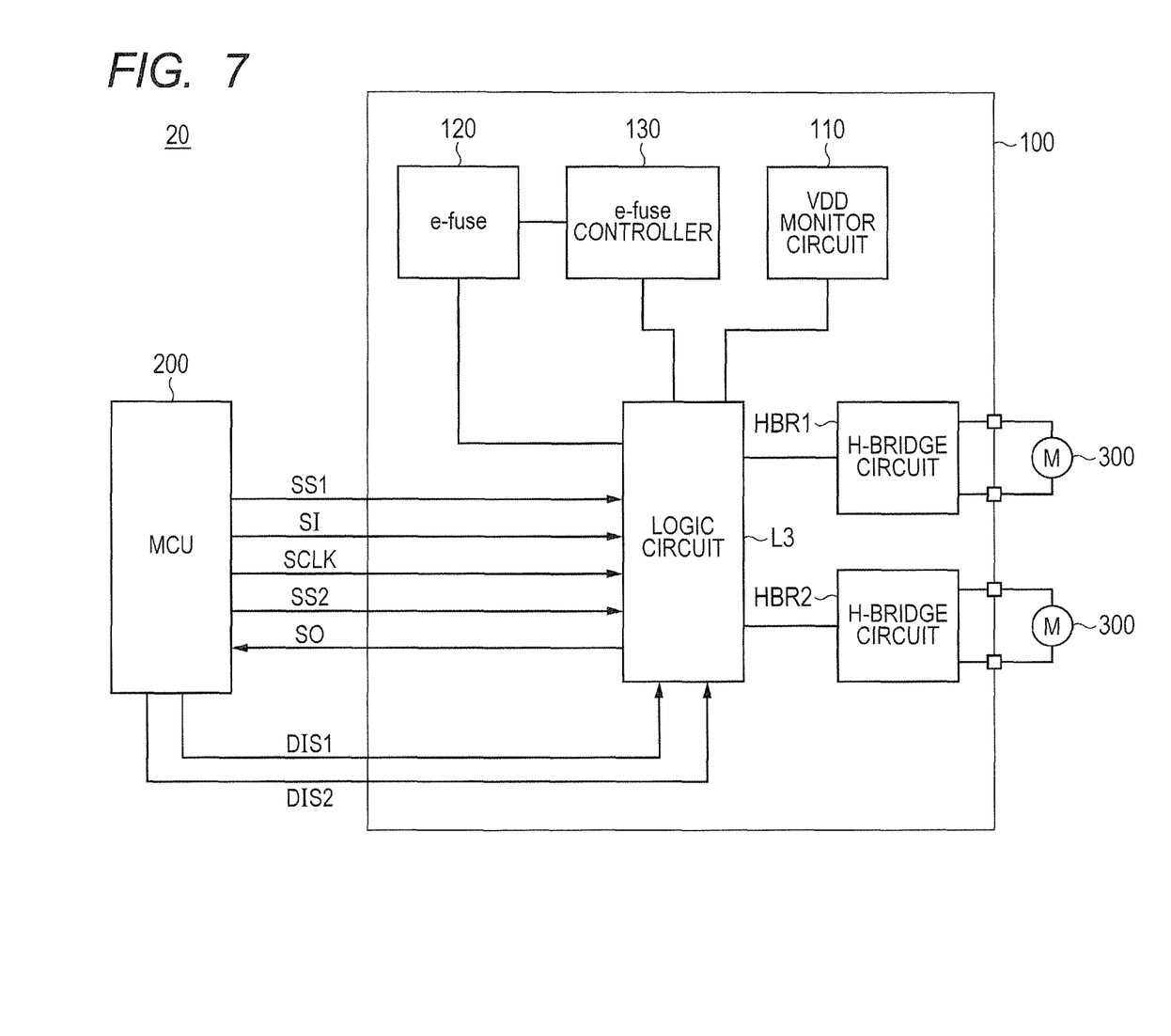
FIG. 7 is a block diagram illustrating one example of a configuration of a semiconductor device according to a third embodiment.

FIG. 7 is a block diagram illustrating one example of a configuration of a semiconductor device 20 according to the third embodiment. The semiconductor device 20 is different from the semiconductor device 10 in the point that the semiconductor chip 100 includes a VDD monitor circuit 110, an e-fuse 120 and an e-fuse controller 130 and the logic circuit L is replaced with a logic circuit L3. In the following, in the semiconductor device 20, points which are different from those in the semiconductor device 10 will be described.

The VDD monitor circuit 110 is a circuit which decides whether a value of a power supply voltage (VDD) supplied to the semiconductor chip 100 is at least a threshold value and is also called a power supply voltage decision circuit. The VDD monitor circuit 110 outputs a decision signal indicating whether the value of the power supply voltage is at least the threshold value which is defined in advance to the logic circuit L3. The logic circuit L3 uses a condition that the value of the power supply voltage is decided to be at least the threshold value by the VDD monitor circuit 110 as one requisite for driving of the H-bridge circuits HBR1 and HBR2.

The e-fuse 120 is an electronic fuse which designates various set values in accordance with a state of a fuse and is also called a fuse circuit. The e-fuse 120 outputs an output signal according to the fuse state to the fuse controller 130. In addition, the e-fuse 120 is a circuit which is configured in such a manner that the fuse is disconnected (cut) in accordance with a signal from any one of other circuits (for example, the logic circuit L3 and so forth) and the output signal differs depending on whether the fuse is cut. For example, the e-fuse 120 includes a resistor and a switch and is configured in such a manner that the switch is changed over in accordance with the signal from any one of the other circuits and overcurrent flows into the resistor. The resistor is disconnected (cut) due to flowing of the overcurrent into the resistor and, as a result, the output signal is changed. Incidentally, fuse disconnection of the e-fuse 120 is performed, for example, in the following manner. First, a disconnect command is transmitted from the MCU 200 to the logic circuit L3 in a state of being contained in the control information input signal S1. Thereby, the logic circuit L3 outputs a disconnection signal according to the disconnect command to the e-fuse 120, The disconnection signal is received by the e-fuse 120 and thereby the fuse is disconnected.

In the third embodiment, the e-fuse 120 is used as the electronic fuse which designates a set value of the above-described threshold value in the VDD monitor circuit 110 by way of example. Incidentally, there may exist a plurality of the e-fuses 120. That is, the set value may be designated in accordance with a combination of output signals from the plurality of e-fuses 120.

The output signal from the e-fuse 120 is input into the e-fuse controller 130, Therefore, the e-fuse controller 130 is able to manage a fuse state of the e-fuse 120, that is, a disconnected situation of the fuse. In the third embodiment, the e-fuse controller 130 is a circuit which decides whether the fuse state of the e-fuse 120 is a predetermined state. Incidentally, the e-fuse controller 130 is also called a fuse state decision circuit. Specifically, for example, the e-fuse controller 130 decides whether fuse disconnection which is requested from the MCU 200 is surely achieved. That is, in a case where the MCU 200 requests to disconnect n (n is an integer of 1 or more) e-fuses 120, the e-fuse controller 130 decides whether the n e-fuses 120 are disconnected in fact. Incidentally, in decision, for example, the command to request fuse disconnection may be informed, for example, from, the logic circuit L3 to the e-fuse controller 130 and/or may be informed directly from the MCU 200 to the e-fuse controller 130. The e-fuse controller 130 outputs a decision signal indicating whether the fuse state of the e-fuse 120 is the predetermined state to the logic circuit L3. Then, the logic circuit L3 uses a condition that the fuse state of the e-fuse 120 is the predetermined state as another requisite for driving of the H-bridge circuits HBR1 and HBR2.

The logic circuit L3 is different from, the logic circuit L in the point that the logic circuit L3 decides the propriety of driving of the H-bridge circuits HBR1 and HBR2 by using other conditions in addition to the signal states of the select signals SS1 and SS2. Specifically, in. a case where the value of the power supply voltage is not at least the threshold value which is set, the logic circuit L3 does not drive the H-bridge circuits HBR1 and HBR2. That is, in a case where the decision signal from the VDD monitor circuit 110 is not a signal (for example, a high level) which, indicates that the value of the power supply voltage is at least the threshold value (in other words, in a case where the decision signal is a signal (for example, a low level) which indicates that the value of the power supply voltage is less than the threshold value), the logic circuit L3 does not drive the H-bridge circuits HBR1 and HBR2.

In addition, in a case where the fuse state of the e-fuse 120 is not the predetermined state, the logic circuit L3 does not drive the H-bridge circuits HBR1 and HBR2. That is, in a case where the decision signal from the e-fuse controller 130 is not a signal (for example, the low level) which indicates that the fuse state of the e-fuse 120 is the predetermined state (in other words, in a case where the decision signal is a signal (for example, the high level) which indicates that the fuse state of the e-fuse 120 is not the predetermined state), the logic circuit L3 does not drive the H-bridge circuits HBR1 and HBR2.

Figure 8:
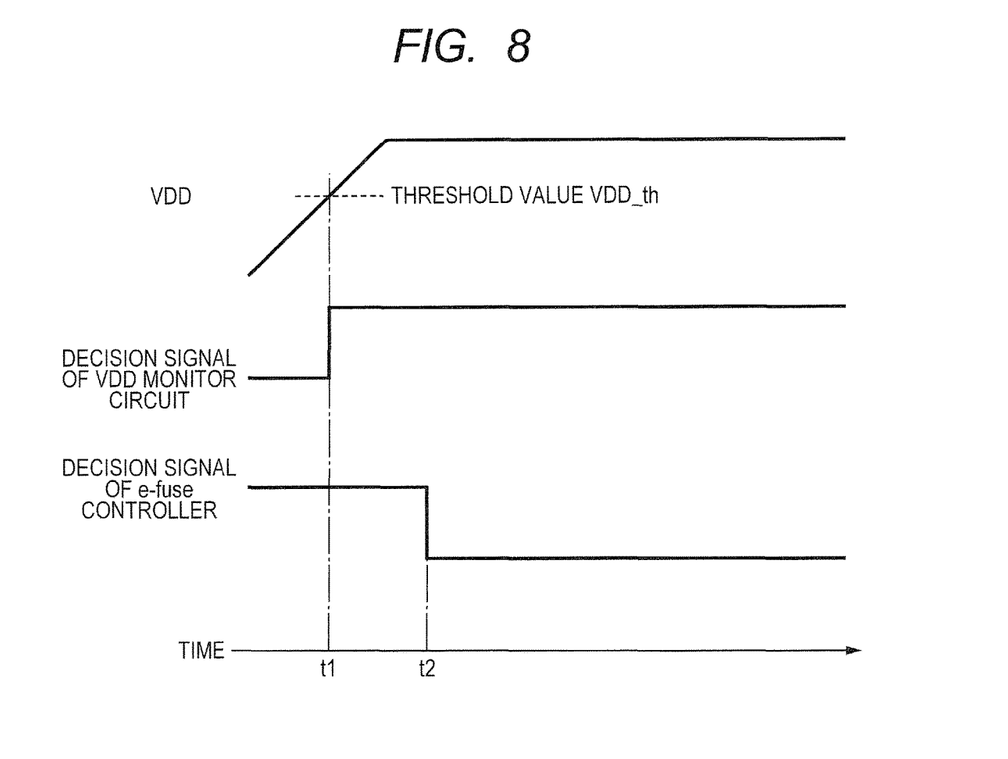
FIG. 8 is a time chart illustrating one example of time transition of a decision signal of a power supply voltage VDD monitor circuit and a decision signal of an e-fuse controller.

FIG. 8 is a time chart illustrating one example of time transition of the decision signal of the power supply voltage VDD monitor circuit 110 and the decision signal of the e-fuse controller 130. In a case where the value of the power supply voltage becomes at least a threshold value VDD_th (see a time t1), the decision signal of the VDD monitor circuit 110 is changed to the signal state (the high level) which indicates that the value of the power supply voltage is at least the threshold value. In addition, then, in a case where the disconnected situation of the e-fuse 120 is confirmed and the fuse state of the e-fuse 120 is decided to be the predetermined state by the e-fuse controller 130 (see a time t2), the decision signal of the e-fuse controller 130 is changed to the signal state (the low level) which indicates that the fuse state is the predetermined state. In this case, the logic circuit L3 does not drive the H-bridge circuits HBR1 and HBR2 until the time t2. After the time t2, the logic circuit L3 drives the H-bridge circuits HBR1 and HBR2 in accordance with the signal states of the select signals SS1 and SS2.

In addition, in the third embodiment, the logic circuit L3 uses further other signals for control of driving of the H-bridge circuits HBR1 and HBR2. Specifically, forcing signals for forcing stop of driving of the H-bridge circuits HBR1 and HBR2 respectively are used. As illustrated in FIG. 7, a forcing signal DIS1 used to force stop of driving of the H-bridge circuit HBR1 and a forcing signal DIS2 used to force stop of driving of the H-bridge circuit HBR2 are input into the logic circuit L3 from the MCU 200. In a case where driving of the H-bridge circuit HBR1 is to be forcedly stopped, the MCU 200 outputs the forcing signal DIS1 to the logic circuit L3. In addition, in a case where driving of the H-bridge circuit HBR2 is to be forcedly stopped, the MCU 200 outputs the forcing signal DIS2 to the logic circuit L3. In a case where the logic circuit L3 receives the forcing signal DIS1, the logic circuit L3 controls in such a mariner that, the H-bridge circuit HBR1 is not driven regardless of the signal states of other signals. In addition, in a case where the logic circuit L3 receives the forcing signal DIS2, the logic circuit L3 controls in such a manner that the H-bridge circuit HBR2 is not driven regardless of the signal states of other signals.

In the foregoing, the third embodiment 3 is described. In the third embodiment, the logic circuit L3 controls driving of the H-bridge circuits HBR1 and HBR2 on the basis of the state of the power supply voltage. Thereby, in a case where the value of the power supply voltage does not reach a predetermined value, it is possible to suppress driving of the H-bridge circuits HBR1 and HBR2. In addition, the logic circuit L3 controls driving of the H-bridge circuits HBR1 and HBR2 on the basis of the fuse state of the e-fuse 120. Thereby, it is possible to suppress driving of the H-bridge circuits HBR1 and HBR2 in a situation where the fuse state is not a desirable state, that is, in a situation where desirable setting is not achieved. In addition, the logic circuit L3 controls driving of the H-bridge circuits HBR1 and HBR2 on the basis of the forcing signals DIS1 and DIS2 respectively. Thereby, it is possible to forcedly inhibit driving of the H-bridge circuits HBR1 and HBR2. Incidentally, also in the third embodiment, output of the chip specification information may be performed similarly to the second embodiment.

In the foregoing, the invention which has been made by the inventors concerned is specifically described on the basis of the embodiments of the present invention. However, it goes without saying that the present invention is not limited to the above-described embodiments and various modifications are possible within a range not deviating from the gist of the present invention. For example, although in the above-described embodiments, the configuration that the two H-bridge circuits HBR1 and HBR2 are provided is described, it goes without saying that the number of the H-bridge circuits may be three or more.

What is claimed is:

1. A semiconductor device comprising:
    a plurality of H-bridge circuits; and
    a logic circuit,
    wherein the logic circuit controls driving of each of the H-bridge circuits using a control signal, provided by a microcontroller, that is shared for control of all of the H-bridge circuits and a valid signal, provided by the microcontroller, that designates whether each of the H-bridge circuits is validated.

2. The semiconductor device according to claim 1,
    wherein in a case where all the valid signals for the H-bridge circuits indicate to validate the H-bridge circuits, the logic circuit controls to stop driving all the H-bridge circuits.

3. The semiconductor device according to claim 1,
    wherein in a case where all the valid signals for the H-bridge circuits indicate to validate the H-bridge circuits, the logic circuit drives only a predetermined H-bridge circuit in the H-bridge circuits in accordance with the control signal.

4. The semiconductor device according to claim 1,
    wherein in a case where some of the valid signals for the H-bridge circuits indicate to validate the H-bridge circuits concerned and the valid signals other than the some of the valid signals indicate to invalidate the H-bridge circuits concerned, the logic circuit controls to stop driving all the H-bridge circuits.

5. The semiconductor device according to claim 1, further comprising:
    a power supply voltage decision circuit which decides whether a value of a power supply voltage is at least a threshold value,
    wherein the logic circuit uses a condition that the value of the power supply voltage is decided to be at least the threshold value by the power supply voltage decision circuit as one requisite for driving of the H-bridge circuit concerned.

6. The semiconductor device according to claim 1, further comprising:
    a fuse circuit which designates a set value in accordance with a state of a fuse; and
    a fuse state decision circuit which decides whether the fuse state of the fuse circuit is a predetermined state,
    wherein the logic circuit uses a condition that the fuse state of the fuse is decided to be the predetermined state by the fuse state decision circuit as another requisite for driving of the H-bridge circuit concerned.

7. The semiconductor device according to claim 1,
    wherein in a case where a forcing signal used to force stop of driving of the H-bridge circuit concerned is received, the logic circuit controls to stop driving the H-bridge circuit concerned.

8. The semiconductor device according to claim 1,
    wherein the H-bridge circuits and the logic circuit are implemented on the same semiconductor chip, and
    wherein the logic circuit outputs chip specification information for specifying the semiconductor chip.

9. The semiconductor device according to claim 1,
    wherein in a case where the respective valid signals for the H-bridge circuits are in predetermined signal states, the logic circuit outputs an error signal.

10. An actuator system comprising:
    an actuator; and
    a semiconductor device,
    wherein the semiconductor device comprises:
        a plurality of H-bridge circuits that control the actuator, and
        a logic circuit, and
        wherein the logic circuit controls driving using a control signal, provided by a microcontroller, that is shared for control of all of the H-bridge circuits and a valid signal, provided by the microcontroller, that designates whether each of the H-bridge circuits is validated.

* * * * *